United States Patent
Pan et al.

(10) Patent No.: US 9,231,124 B2
(45) Date of Patent: Jan. 5, 2016

(54) BALL GRID ARRAY PACKAGED CAMERA DEVICE SOLDERED TO A SUBSTRATE

(71) Applicant: DELPHI TECHNOLOGIES, INC., Troy, MI (US)

(72) Inventors: Binghua Pan, Singapore (SG); Yew Kwang Low, Singapore (SG); Sim Ying Yong, Singapore (SG)

(73) Assignee: Delphi Technologies, Inc., Troy, MI (US)

( * ) Notice: Subject to any disclaimer, the term of this patent is extended or adjusted under 35 U.S.C. 154(b) by 133 days.

(21) Appl. No.: 14/036,017

(22) Filed: Sep. 25, 2013

(65) Prior Publication Data

US 2015/0084150 A1 Mar. 26, 2015

(51) Int. Cl.
*H01L 31/00* (2006.01)
*H01L 31/02* (2006.01)
*H01L 27/146* (2006.01)

(52) U.S. Cl.
CPC .... *H01L 31/02005* (2013.01); *H01L 27/14618* (2013.01); *H01L 27/14636* (2013.01); *H01L 2924/0002* (2013.01)

(58) Field of Classification Search
CPC ............... H01L 24/81; H01L 24/17; H01L 2021/60247; H01L 24/14; H01L 24/742; H01L 2224/1012; H01L 2224/1703; H01L 2224/17051
USPC ......... 257/777, 778, 782, 783, 723, 678, 737, 257/738
See application file for complete search history.

(56) References Cited

U.S. PATENT DOCUMENTS

| | | | |
|---|---|---|---|
| 7,118,940 B1 | 10/2006 | Myers et al. | |
| 7,384,818 B2 | 6/2008 | Kim et al. | |
| 8,063,982 B2 | 11/2011 | Kim et al. | |
| 8,916,969 B2* | 12/2014 | Chen | H01L 23/16 257/737 |
| 2005/0077080 A1 | 4/2005 | Dairo et al. | |
| 2005/0093153 A1* | 5/2005 | Liu | H01L 23/3114 257/738 |
| 2006/0132644 A1* | 6/2006 | Shangguan et al. | 348/374 |
| 2006/0192295 A1* | 8/2006 | Lee | H01L 23/16 257/778 |
| 2007/0267712 A1* | 11/2007 | Fujita et al. | 257/443 |
| 2008/0135728 A1 | 6/2008 | Yang et al. | |
| 2008/0164550 A1* | 7/2008 | Chen et al. | 257/432 |
| 2008/0191333 A1 | 8/2008 | Yang et al. | |
| 2008/0224309 A1* | 9/2008 | Hori | H01L 24/81 257/737 |
| 2008/0272473 A1* | 11/2008 | Matsumoto et al. | 257/680 |
| 2008/0293232 A1* | 11/2008 | Kang | H01L 24/14 438/612 |
| 2009/0200663 A1* | 8/2009 | Daubenspeck | H01L 23/49811 257/737 |
| 2010/0109114 A1 | 5/2010 | Izumi | |
| 2013/0026623 A1 | 1/2013 | Chen et al. | |

OTHER PUBLICATIONS

European Search Report dated Jan. 16, 2015.

* cited by examiner

*Primary Examiner* — Thanh Y Tran
(74) *Attorney, Agent, or Firm* — Lawrence D. Hazelton

(57) ABSTRACT

An assembly that attaches a ball grid array (BGA) packaged camera device to a printed circuit board (PCB) substrate is provided. The assembly includes a spacer between the device and the substrate. The spacer is configured to prevent excessive collapse of solder balls located between the device and the substrate during reflow of the solder balls. The spacer includes one of solder mask, tape, and/or legend ink.

8 Claims, 2 Drawing Sheets

BALL GRID ARRAY PACKAGED CAMERA DEVICE SOLDERED TO A SUBSTRATE

TECHNICAL FIELD OF INVENTION

This disclosure generally relates to assembly for attaching a ball grid array (BGA) packaged camera device to a printed circuit board (PCB) substrate, and more particularly relates to a spacer between the device and the substrate formed of solder mask, tape, and/or legend ink

BACKGROUND OF INVENTION

It is known to package electronic devices in ball grid array (BGA) type packages for attaching the devices to a printed circuit board (PCB) substrate. It is known to attach an image sensor integrated circuit to a substrate using BGA techniques. However, if the image sensor is coupled to a lens module to form a BGA packaged camera device, the weight of the camera device may cause excessive collapse of solder balls located between the device and the substrate during reflow of the solder balls. Furthermore, the weight of the camera device may be too great for the solder balls, especially in applications that are subject to relatively high levels of vibration, and/or when the substrate is oriented vertically or on edge so the camera device is oriented sideways.

SUMMARY OF THE INVENTION

In accordance with one embodiment, an assembly that attaches a ball grid array (BGA) packaged camera device to a printed circuit board (PCB) substrate is provided. The assembly includes a spacer between the device and the substrate. The spacer is configured to prevent excessive collapse of solder balls located between the device and the substrate during reflow of the solder balls. The spacer includes one of solder mask, tape, and legend ink.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
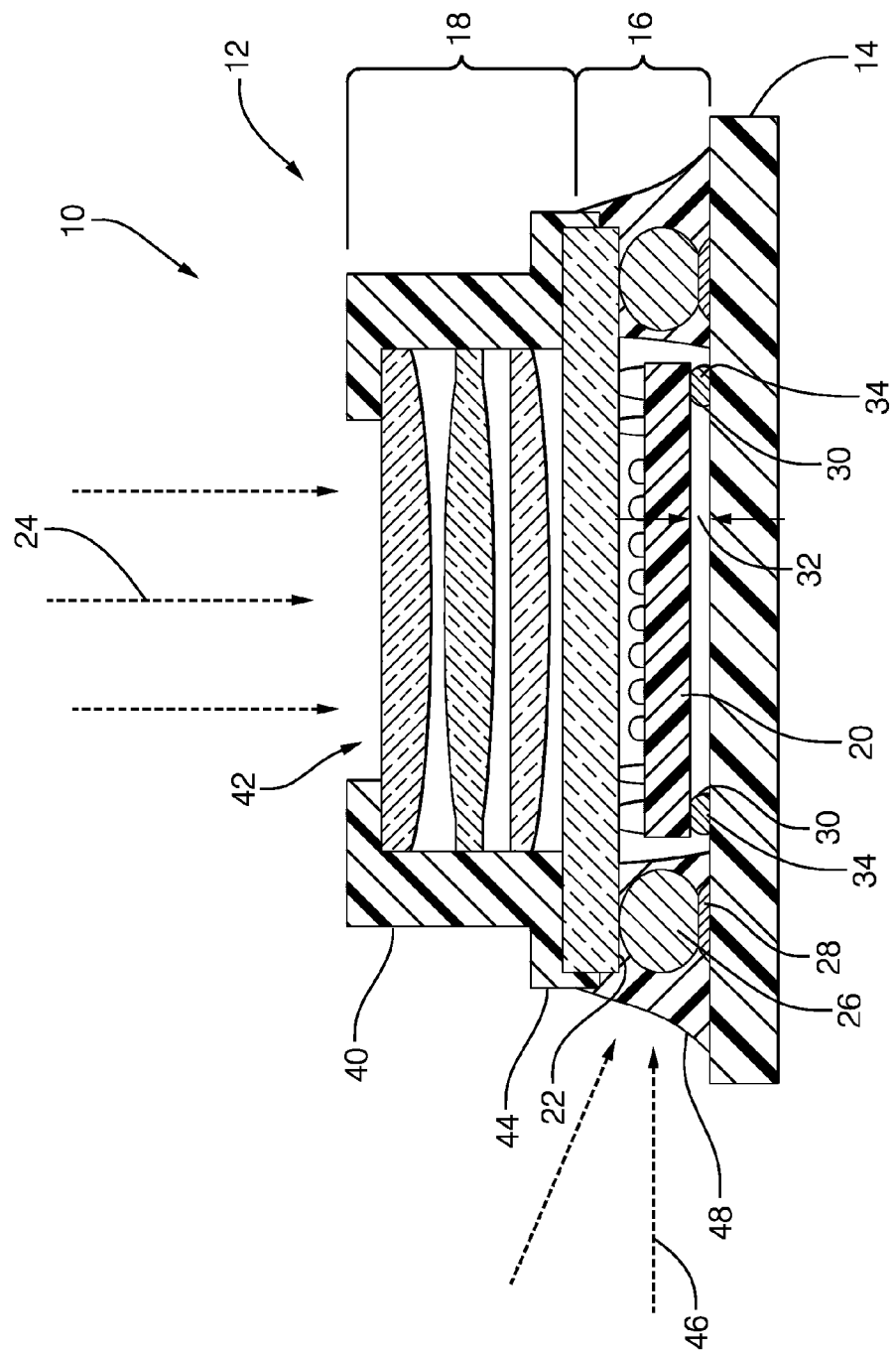
FIG. 1 is a side view of a camera device in accordance with one embodiment.

FIG. 1 illustrates a non-limiting example of an assembly 10 that attaches a ball grid array (BGA) packaged camera device, hereafter the device 12, to a printed circuit board (PCB) substrate, hereafter the substrate 14. In general, the device 12 includes an image sensor 16 and a lens module 18. A suitable example of the image sensor 16 is an Avocet Image Sensor model MLX75412 available from Melixis Microelectronic Systems with offices located worldwide. In general, the image sensor 16 includes an imager circuit 20 attached to a glass cover 22 and oriented so image light 24 passing through the lens module 18 can be detected by the active-side (side towards the lens module 18) of the imager circuit 20. The image sensor 16 is typically supplied with solder balls 26 for attaching the image sensor 16, or in this case the device 12, to conductor material 28 of the substrate 14. The glass cover 22 typically includes conductor traces (not shown) configured to interconnect the imager circuit 20 to the solder balls 26, and provide a location to attach the solder balls 26 as part of forming a ball grid array (BGA) type package, as will be recognized by those in the art. In general, the conductor traces or circuitry on the glass cover 22 is configured to not interfere with the image light 24 propagating to the imager circuit 20. By way of example and not limitation, the conductor material 28 may be formed of copper foil if the substrate is formed of the well-known FR-4 type circuit board material. Alternatively, the conductor material 28 may be formed of thick-film ink if the substrate is formed of ceramic material, for example, alumina (Al2O3), aluminum nitride (AlN), or low temperature co-fire ceramic (LTCC).

In some manufacturing situations it may be preferable for the device 12 to be received ready for attaching (i.e. soldering) to the substrate 14 with the lens module 18 already attached to the image sensor 16. Receiving the device 12 fully assembled allow for more complete testing of the device 12 prior to being attached to the substrate 14. However, it has been discovered that during solder reflow the weight of the device 12, which includes additional weight of the lens module 18, may cause the solder balls 26 to collapse excessively, possibly causing short circuits between adjacent solder balls. In order to prevent excessive collapse of the solder balls 26 located between the device 12 and the substrate 14 during reflow of the solder balls 26, the assembly 10 includes a spacer 30 between the device 12 and the substrate 14. In this example, the spacer 30 is located between the back-side (as opposed to the active-side) of the imager circuit 20. The height 32 of the spacer 30 is selected to prevent excessive collapse of the solder balls 26 during reflow. As will be described in more detail below, the spacer 30 may be formed of, individually or in combination, conductor material, solder mask, tape, and/or legend ink.

Continuing to refer to FIG. 1, in one embodiment the spacer 30 may be formed of dots (i.e. circles), lines, squares, or other shapes if the spacer is formed of legend ink or solder mask. As used herein, legend ink is typically a white or yellow material used on FR-4 type circuit boards to print part numbers, component identifiers, company logos, and the like. On FR-4 type circuit boards, solder mask is typically a green colored material that is normally used to protect conductive material from spatters of solder, corrosion, or other contaminants. However, it is not a requirement that solder mask overlay conductive material as it may be applied directly to the laminate of the FR-4 substrate. Legend ink and solder mask are typically applied using known screen printing processes. The height 32 of the spacer 30 when formed by legend ink or solder mask is generally determined by the thickness of the stencil or screen emulsion. However, if the dots 34 have a dot size, or the shape of the object has lateral dimension, that is less than or similar to the printed thickness determined by the stencil or screen emulsion, the dot size of the dots 34 may be selected to control or determine the height 32 of the spacer 30. It has been observed that when the material (e.g. legend ink or solder mask) is printed, surface tension may deform the material to have a domed shape. As such, if the dot size of the dots 34 is small enough, the height 32 of the dots 34 may be less than what would occur if the dot size was substantially larger than the thickness of the stencil or screen emulsion, for example a dot size having a diameter more than five times (5×) the thickness of the stencil or screen emulsion. Providing the spacer 30 using screen printed materials that are already being printed elsewhere on the substrate 14 is advantageous as providing the spacer 30 does not substantially increase cost as the printing process is already being performed.

Figure 2:
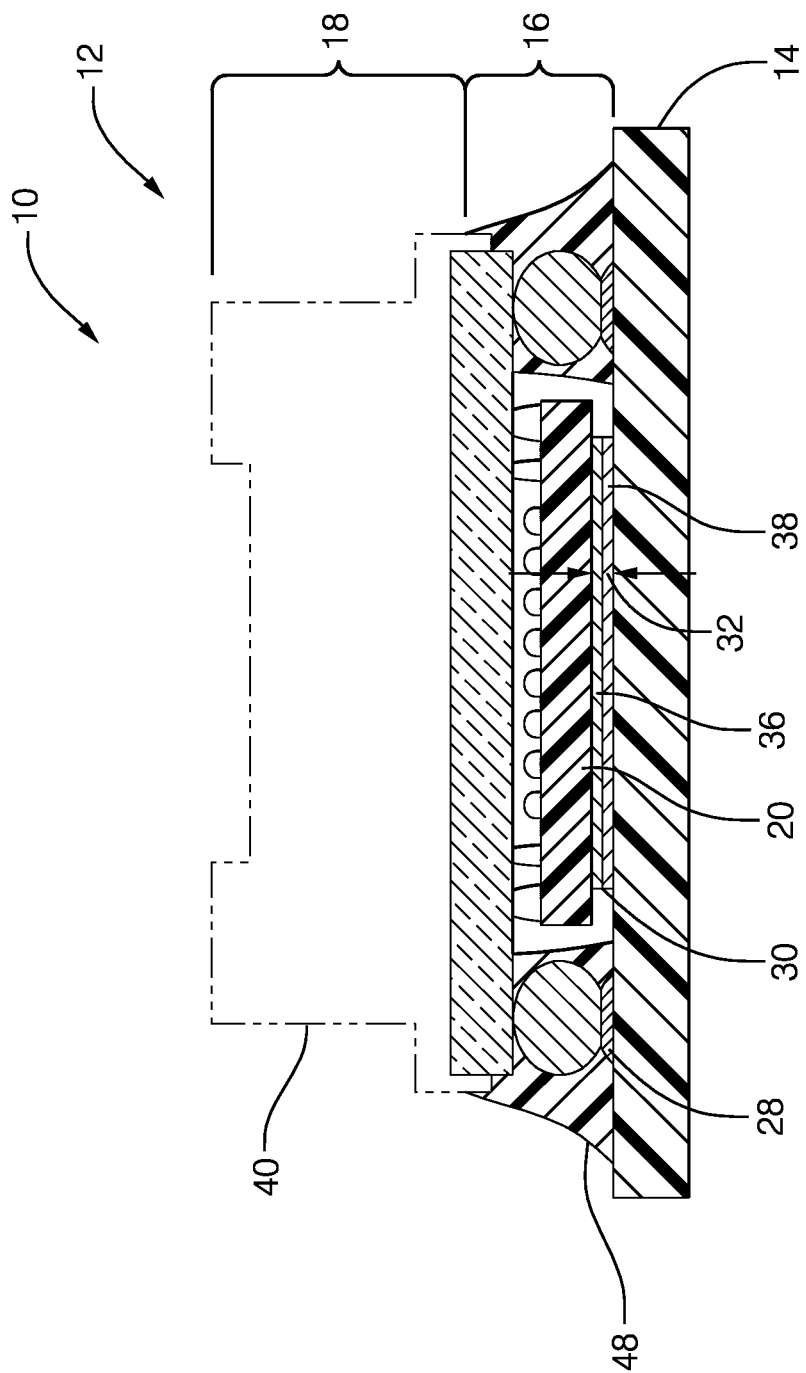
FIG. 2 is a partial side view of a camera device in accordance with one embodiment.

FIG. 2 illustrates a non-limiting alternative to the example shown in FIG. 1. FIG. 2 is a more close in view relative to FIG. 1 only to provide a more detailed view of the spacer 30. In this example the spacer 30 covers an area substantially larger than the dots 34 shown in FIG. 1. In this example, the spacer 30 is generally formed of two layers, a first layer 36, and a second layer 38. In one embodiment, the second layer 38 may be formed of the conductor material 28 used to define attachment locations for the solder balls 26. If necessary to form a spacer with adequate height, the first layer 36 may be formed of solder mask overlaying the conductor material used to form the second layer 38. It may be advantageous to include the conductor material 28 as part of the spacer 30 as the thickness of, for example, the copper foil used as the conductor material is not subject to potential variations in thickness as may be the case for screen printed materials. A dummy conductor plane may be provided there if actual circuitry does not need active conductor traces to be running across at the location. However, if the conductor material 28 alone is not thick enough to form a spacer 30 with the height 32 that is desired, solder mask may be added to the spacer 30, either in the form of dots on top of the conductor material, or as a continuous layer over the conductor material. There is a known type of temporary solder mask, commonly called peelable solder mask, that is often used to apply on PCB substrate to cover/protect certain locations for certain exposures, high temperature or/and solvent cleaning steps, for example. The peelable solder mask may be peeled or otherwise removed from the substrate 14 to expose the previously protected locations. This peelable solder mask can be applied on top of conventional solder mask, which is generally not peelable or removable, or applied directly on top of conductor 28, or even directly on laminate of the PCB substrate 14, to form a spacer 30 the same way as typical solder mask. Peelable solder mask dry film is typically thicker than traditional solder mask, and so provides a way to form thicker spacers. It should be recognized that when the spacer 30 is formed of peelable solder mask, the peelable solder mask will not be peeled away.

In another embodiment, the spacer 30 may be formed of tape, film, or other sheet like material, which may be attached to either the substrate or the bottom side of the imager circuit 20 with, for example, a pressure sensitive adhesive (PSA). If the spacer 30 is to be attached to the substrate 14, then the first layer 36 would be, for example, a MYLAR® film, and the second layer 38 would be the pressure sensitive adhesive. However, if the spacer 30 is to be attached to the bottom side of the imager circuit 20, then the first layer 36 would be the pressure sensitive adhesive, and the second layer 38 would be the MYLAR® film. Tape or film may be advantageous over screen printed materials if the height 32 needs to be more tightly controlled and precise than is convenient with screen printed materials, or if the height 32 is a value that is not readily provided by screen printed materials, i.e. is too thick (high) or too thin (low).

Many other combinations of conductor material, solder mask, tape, and/or legend ink are envisioned. A key feature of the spacer 30 is that it is located underneath the imager circuit 20 so the means to support the image sensor 16 to prevent excessive collapse of the solder balls 26 during reflow does not waste valuable space on the substrate 14.

Referring back to FIG. 1, the device 12 may include a lens holder 40 generally configured to hold one or more lenses 42 in proper relation to each other. By way of example and not limitation, the lens holder 40 is preferably formed of opaque material, and is typically black in color. The lens holder 40 may also be configured to couple a lens module 18 to the image sensor 16, and thereby help to form the device 12. The lens holder 40 may also define sidewalls 44 that extend around the image sensor 16 toward the substrate 14 to prevent laterally directed light 46 from being detected by the image sensor 16. In particular, the sidewalls 44 preferably extend sufficiently toward the substrate 14 so that the laterally directed light 46 is prevented from entering the edge of the glass cover 22 and possibly impinging on the active-side of the imager circuit 20. In instances where underfill or side-fill materials are needed, lens holder 40 preferably does not extend too much below the side walls 44 so as to not hinder material flow into the gap between glass cover 22 and the substrate 14.

In some applications, the assembly 10 may be oriented at right angles to the orientation illustrate in FIGS. 1 and 2. That is, the assembly 10 may be oriented to capture a field of view generally characterized as a horizontal field of view. In this horizontal orientation, the weight of the lens module 18 may cause excessive mechanical load on the solder balls 26 due to the force of gravity on the lens module 18, especially during the vibration and thermal cycling typically experienced in automotive environment applications. To prevent damage to the solder balls 26, the assembly 10 may include side-fill 48 configured to couple the lens module 18 to the substrate 14. As used herein, the term side-fill is distinguished from the well-known term under-fill which is used to describe the process whereby capillary action is relied upon to draw material into the entire area under, for example, an electronic device. In contrast, the side-fill 48 deliberately avoids this capillary action by using, for example, a thixotropic material that is not drawn underneath the imager circuit 20.

The side-fill 48 may be preferably formed of optically opaque (e.g. black) material to prevent the laterally directed light 48 from impinging on the image sensor 16 or the image circuit 20. As illustrated, the side-fill 48 may overlap the sidewalls 44 to block the laterally directed light 46.

Accordingly, an assembly 10 that attaches a ball grid array (BGA) packaged camera device (the device 12) to a printed circuit board (PCB) substrate (the substrate 14) is provided. By adding the spacer 30, excessive collapse of the solder balls 26 during reflow is avoided. Using legend ink or solder mask to form the spacer 30, with or without the conductor material 28, provides a means for providing the spacer 30 that does not require an additional process step if the legend ink and/or the solder mask are already being applied to the substrate 14 for other reasons. Alternatively, using tape or film to form the spacer 30 provides a means to provide the spacer 30 with the height 32 that may not be possible with screen printed materials (e.g. legend ink or solder mask)

While this invention has been described in terms of the preferred embodiments thereof, it is not intended to be so limited, but rather only to the extent set forth in the claims that follow.

We claim:

1. An assembly that attaches a ball grid array (BGA) packaged camera device to a printed circuit board (PCB) substrate, said assembly comprising:

a spacer between the device and the substrate, said spacer configured to prevent excessive collapse of solder balls located between the device and the substrate during reflow of the solder balls, wherein the spacer comprises one of solder mask, tape, and legend ink, wherein the device includes a lens holder configured to couple a lens module to an image sensor, wherein the lens holder defines sidewalls that extend around the image sensor toward the substrate to prevent laterally directed light from being detected by the image sensor.

2. The assembly in accordance with claim 1, wherein the spacer is formed of dots if the spacer is formed of legend ink or solder mask.

3. The assembly in accordance with claim 2, wherein a dot size of the dots is selected to determine a height of the spacer.

4. The assembly in accordance with claim 1, wherein the spacer includes conductor material of the substrate.

5. The assembly in accordance with claim 1, wherein the spacer is applied to one of the substrate, and a bottom side of an image sensor of the device, if the spacer is formed of tape.

6. The assembly in accordance with claim 1, wherein the assembly includes side-fill configured to couple a lens module of the device to the substrate.

7. The assembly in accordance with claim 1, wherein the side-fill is formed of optically opaque material to prevent laterally directed light from impinging on the image sensor.

8. The assembly in accordance with claim 1, wherein the spacer has a higher melting temperature than the solder.

* * * * *